ized Sta[11] 4,114,191

Lund [45] Sep. 12, 1978

[54] BUBBLE DOMAIN STRUCTURING IN BUBBLE DOMAIN MEMORY PLANE

[75] Inventor: Roger Edward Lund, Woodbury, Minn.

[73] Assignee: Sperry Rand Corporation, New York, N.Y.

[21] Appl. No.: 786,316

[22] Filed: Apr. 11, 1977

[51] Int. Cl.² ............................................. G11C 19/08
[52] U.S. Cl. ............................................ 365/2; 365/37
[58] Field of Search ................ 340/174 TF; 365/2, 37

[56] References Cited

U.S. PATENT DOCUMENTS

| 3,715,736 | 2/1973 | O'Donnell et al. ................ 365/2 |
| 3,717,853 | 2/1973 | O'Donnell et al. ................ 365/2 |
| 3,790,935 | 2/1974 | Luff ................................. 340/174 TF |
| 3,913,079 | 10/1975 | Rosier ............................. 340/174 TF |
| 4,011,550 | 3/1977 | Torok et al. ..................... 340/174 TF |

Primary Examiner—James W. Moffitt
Attorney, Agent, or Firm—Kenneth T. Grace; William E. Cleaver; Marshall M. Truex

[57] ABSTRACT

Defining the structuring of bubble domains in a magnetizable layer of a bubble domain memory plane is determined by modifying the magnetic characteristics of the magnetizable layer in the confinement area. The bubble domain memory plane is comprised of a non-magnetic Gadolinium Gallium Garnet (GGG) layer which is a supporting layer upon which is formed by the liquid phase epitaxy (LPE) method a plurality of magnetizable layers in each of which a bubble domain is capable of being generated and sustained. Upon the memory plane are formed, as by any of many well-known deposition techniques, a matrix array of a parallel set of horizontally oriented X drive lines and an orthogonally oriented parallel set of Y drive lines. Each X drive line, Y drive line intersection of the matrix array defines a memory area having four quadrants. In only one of the four quadrants is there provided a bubble domain supporting magnetizable layer, all other areas of the memory plane having no magnetizable layer or a magnetizable layer of an insufficient thickness to support bubble domains therein. Accordingly, in only one of the four quadrants of each of the memory areas is there a magnetizable layer of sufficient thickness to support a bubble domain thereat.

4 Claims, 4 Drawing Figures

BUBBLE DOMAIN STRUCTURING IN BUBBLE DOMAIN MEMORY PLANE

BACKGROUND OF THE INVENTION

In the prior art it is known that the magnetic characteristics of a bubble domain supporting magnetizable layer may be modified to offset the capability of the magnetizable layer to sustain bubble domains therein or to permit the movement of bubble domains therethrough. Such methods include the generation of thickness gradients within the bubble domain magnetizable layer to restrict movement therethrough—see the publication "Effects Of Abrupt Changes In Film Thickness On Magnetic Bubble Forces", T. W. Collins, et al, IBM J. Res. Develop., March 1976, pp. 132–137—and Permalloy overlays and bubble lattice files (BLF)—see the publication "The Frontiers Of Magnetic Bubble Technology", M. S. Cohen, et al, Proceedings of the IEEE, Volume 63, No. 8, August 1975, pp. 1196–1206—and ion-implanted structures—see the publication "Bubble Domain Propagation Mechanisms In Ion-Implanted Structures", G. S. Almasi, et al, AIP Conference Proceedings, No. 24, 3M - 1974, pp. 630–632. In the C. F. O'Donnell, et al, Pat. Nos. 3,715,736 and 3,717,853, there are disclosed bubble domain memory planes in which the bubble domain supporting magnetizable layers have a plurality of isolated thick regions surrounded by relatively thinner regions. The bubble domains preferentially move into and remain in the thicker regions from the thinner regions; however, the bubble domains may be moved between the thick regions through the thin regions. The present invention is directed toward an improved structuring of bubble domains in a bubble domain memory plane.

SUMMARY OF THE INVENTION

The present invention is directed toward an apparatus for and a method of defining the structuring of bubble domains in the magnetizable layer of a bubble domain memory plane. The structuring or spatial positioning of the bubble domains in the magnetizable layer is determined by modifying the magnetic characteristics of the magnetizable layer in the memory area whereby the bubble domains may exist in only a small localized confinement area associated with each memory area of the memory plane. Accordingly, the existence of the bubble domain in the confinement area may be utilized to define a first binary state while the nonexistence of the bubble domain in the confinement area and, accordingly, the memory area may be utilized to define the second binary state.

DESCRIPTION OF THE PREFERRED EMBODIMENTS

Figure 1:
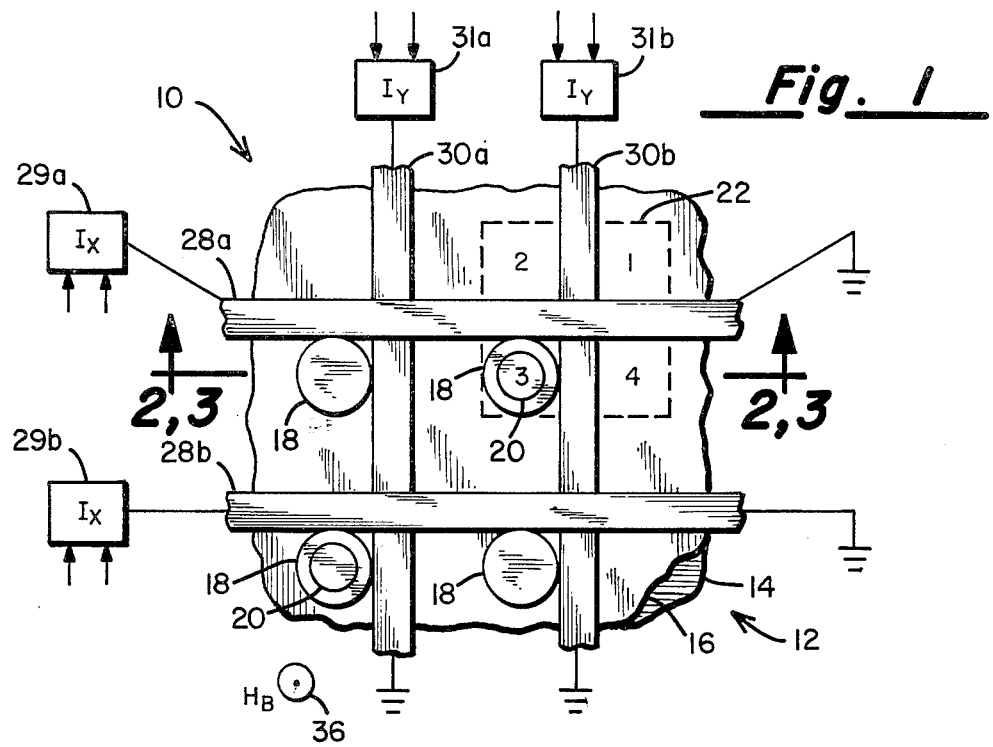
FIG. 1 is a block diagram of a bubble domain memory system incorporating the present invention.
Figure 2:
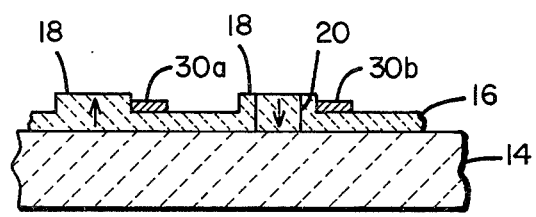
FIG. 2 is a cross-sectional view of a first embodiment of the memory plane of FIG. 1 taken along line 2—2 thereof.

With particular reference to FIG. 1 there is presented a block diagram of a bubble domain memory system 10 incorporating the present invention. System 10 includes a memory plane 12 which is a laminated, integral structure the layers of which are preferably formed by the liquid phase epitaxy (LPE) method. With particular reference to FIG. 2 there is presented an illustration of a cross section of a memory plane 12 of FIG. 1 taken along line 2—2 thereof for providing an illustration of a first embodiment of the present invention, while with particular reference to FIG. 3 there is presented an illustration of a cross section of a memory plane 12 of FIG. 1 taken along line 3—3 thereof for the purpose of illustrating a second embodiment of the present invention.

FIG. 2 illustrates that memory plane 12 is comprised of a plurality of stacked, superposed layers preferably integrally formed by the liquid phase epitaxial method and is comprised of a non-magnetic garnet support layer 14 of Gadolinium Gallium Garnet (GGG) of approximately 80 microns ($\mu$m) in thickness upon which is formed a bubble domain layer 16 of a magnetizable material of 5–10 $\mu$m in thickness in which a plurality of bubble domains 20 may be generated, sustained and moved about.

Figure 3:
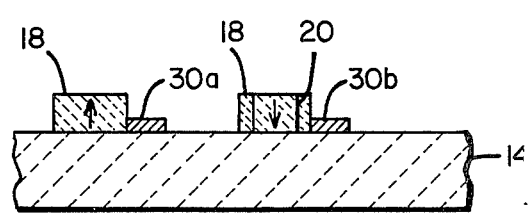
FIG. 3 is a cross-sectional view of a second embodiment of the memory plane of FIG. 1 taken along line 3—3 thereof.

In both the first and second embodiments of FIGS. 2 and 3, there is formed upon substrate layer 14 a plurality of, e.g., circular, confinement areas 18, which are formed from the bubble domain supporting magnetizable layer 16. Each of the confinement areas 18 is of a thickness that is sufficient to support a bubble domain 20 and each of whose side dimensions or diameters are substantially larger, i.e., up to 50% larger, than that of a bubble domain 20 that would normally be supported by layer 16. In the first embodiment of FIG. 2, the confinement areas 18 are formed from the continuous layer 16 by, e.g., an ion milling technique—see the publication "Microstructure Arrays Produced By Ion Milling", E. G. Spencer, et al, Journal of Applied Physics, Volume 17, No. 8, Oct. 15, 1970, pp. 328–332—or any of other various techniques such as chemical etching. Sufficient material, except in the area of confinement areas 18, is removed from the surface of layer 16 so as to reduce the remaining portion of the layer 16 to a thickness that is insufficient to support bubble domains therein. In the second embodiment of FIG. 3, in contrast, layer 16, except in the area of confinement areas 18, is entirely removed from the top surface of support layer 14, as in the methods used to produce the first embodiment of FIG. 2.

In both the first and second embodiments of FIGS. 2 and 3 there are then formed along the edge of the confinement areas 18 a matrix array of a parallel set of horizontally oriented X drive lines 28a, 28b and an orthogonally oriented parallel set of Y drive lines 30a, 30b. In the configuration illustrated in FIG. 1, the X and Y drive lines form at each at their intersections a memory area 22, the intersecting X and Y drive lines defining four quadrants, four corner oriented ones of which are illustrated in each of the memory areas 22 of FIG. 1 as quadrants 1, 2, 3 and 4. The configuration of the confinement areas 18 of FIG. 1 indicates that bubble domains 20 may be written into memory plane 12 at only quadrant 3 of each memory area 22 at each intersection of the X, Y drive lines 28, 30.

Figure 4:
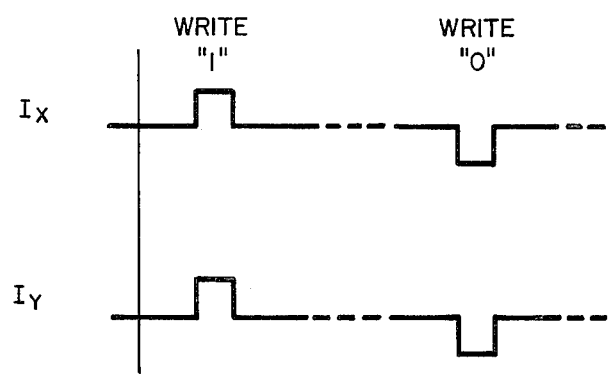
FIG. 4 is an illustration of the waveform of the drive signals that are utilized by the system of FIG. 1.

With particular reference to FIG. 4 there are presented illustrations of the waveform associated with the operation of system 10 of FIG. 1. In operating system 10 of FIG. 1, a selected one of the X drive field sources 29a or 29b and a selected one of the Y drive field sources 31a or 31b are concurrently energized for coupling to the associated X drive line 28a or 28b and the associated Y drive line 30a or 30b, respectively, a half-select drive field, of an, e.g., positive polarity pulse for writing a "1" by the generation of a bubble domain 20 in the one fully selected confinement area 18 at the intersection of the two half-selected X and Y drive lines or, alternatively, by the coupling of an, e.g., negative polarity pulse for the annihilation of the bubble domain 20 at the one fully selected confinement area 18. Thus, a write "1" operation generates and establishes a bubble domain 20 in the one fully selected confinement area 18 and, conversely, a write "0" operation annihilates a bubble domain 20, if in existence at the one fully selected confinement area 18; accordingly the writing of a "1" establishes a bubble 20 in the one fully selected confinement area 18 of the respectively associated quadrant 3 or, alternatively, the writing of a "0" establishes no bubble domain 20 in the one fully selected quadrant 1 of the one fully selected memory area 22. Provided is a bias field $H_B$, as represented by the dot and concentric circle 36, which implies a field directed normal to the plane of the layer 16. Such bias field $H_B$ may be provided by a configuration of Helmholtz coils such as illustrated in the A. H. Bobeck U.S. Pat. No. 3,534,347.

Accordingly, it can be seen that the present invention provides a novel means of structuring the positions of a plurality of bubble domains within the bubble domain memory plane in a predetermined and predictable manner. By utilizing the existence of localized areas of bubble domain supporting material at each memory area the natural structure of the magnetic characteristics of the bubble domain supporting layer are utilized thereby permitting the elimination of complex overlays of, e.g., Permalloy propagation patterns.

What is claimed is:

1. A bubble domain memory plane, comprising:
    a non-magnetic substrate;
    a plurality of layers of magnetizable material superposed said substrate in each of which layers a bubble domain may be generated and sustained by appropriate drive fields;
    a parallel set of X drive lines; superposed said substrate
    a parallel set of Y drive lines insulatively superposed and orthogonally oriented with respect to said parallel set of X drive lines for forming a plurality of memory areas one at each X, Y drive line intersection, each of said memory areas having four corner oriented quadrants; and,
    each one of said bubble domain sustaining layers oriented in only one of said four quadrants of each of said memory areas for forming a bubble domain confinement area in said only one of said four quadrants of each of said memory areas.

2. A bubble domain memory plane, comprising:
    a non-magnetic substrate;
    a layer of magnetizable material formed upon said non-magnetic substrate in a matrix array of confinement areas each of which is capable of sustaining bubble domains, said confinement areas surrounded by said layer of magnetizable material which is incapable of sustaining bubble domains; and,
    a parallel set of X drive lines and an orthogonally oriented, insulatively superposed parallel set of Y drive lines forming a memory area at each X, Y drive line intersection, each memory area having four corner oriented quadrants for positioning only one of said confinement areas in only a like oriented one of the four quadrants of each of said memory areas.

3. The bubble domain memory plane of claim 2 in which said confinement area is up to 50% larger than the diameter of a bubble domain that would normally be sustained by said layer in said confinement areas.

4. The bubble domain memory plane of claim 3 further including:
    X and Y drive field generating means coupled to said X and Y drive lines selectively coupling first or second half-select drive currents to a selected one of said X and said Y drive lines for selectively generating or annihilating a bubble domain in only the one fully-selected confinement area.

* * * * *